United States Patent
Canaperi et al.

(10) Patent No.: US 6,361,402 B1
(45) Date of Patent: Mar. 26, 2002

(54) METHOD FOR PLANARIZING PHOTORESIST

(75) Inventors: Donald F. Canaperi, Bridgewater, CT (US); Rangarajan Jagannathan, Essex Junction, VT (US); Mahadevaiyer Krishnan, Hopewell Junction, NY (US); Max G. Levy, Essex Junction, VT (US); Uma Satyendra; Matthew Sendelbach, both of Wappingers Falls, NY (US); James A. Tornello, Cortlandt Manor; William Wille, Red Hook, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/427,492

(22) Filed: Oct. 26, 1999

(51) Int. Cl.[7] .................................................. B24B 1/00
(52) U.S. Cl. .......................................... 451/41; 451/36
(58) Field of Search .............................. 451/41, 36, 288, 451/287; 156/636.1, 645; 437/228, 235

(56) References Cited

U.S. PATENT DOCUMENTS 4,702,792 A * 10/1987 Chow et al. ................. 156/645
5,618,381 A * 4/1997 Doan et al. .................. 438/633

* cited by examiner

Primary Examiner—Robert A. Rose
(74) Attorney, Agent, or Firm—Tiffany L. Townsend

(57) ABSTRACT

A method for polishing an object having a layer of photoresist, the method, employing the following steps:
  a) applying a layer of slurry on an a layer of photoresist on an object having a first and a second side, the layer of photoresist on one of the first and second side, the object having a center axis perpendicular to the first and second side;
  b) contacting the layer of slurry with a pad having a first and second side, the first side of the pad exerting a force on the slurry.

22 Claims, 1 Drawing Sheet

METHOD FOR PLANARIZING PHOTORESIST

FIELD OF THE INVENTION

The field of the present invention relates generally to semiconductor fabrication and more particularly, to a method of planarizing photoresist.

BACKGROUND OF THE INVENTION

Historically, when lines, vias and other features needed to be created during the semiconductor fabrication process, they were created in and on durable substrates, e.g. silicon, silicon oxide, silicon nitride, aluminum and aluminum alloy. Since most depositions of materials are conformal, the features usually need to be planarized so that there is a "level" surface on which to build the ext layer. The non-planarity of a surface may be extensive in areas with a larger number of features at close or irregular intervals. There are a number of methods that can be used to planarize the surface of a substrate after the current level of features has been formed. It is generally agreed upon that the less complex processing steps are preferred over more complex processing steps. It is also generally agreed upon that the fewer processing steps per feature formation the better.

One of the disadvantages of using certain materials during semiconductor processing is that the materials must be cleaned before and/or after planarization. Some of the more common planarization methods include reactive ion etching (RIE) and chemical/mechanical polishing (CMP). Each method has its advantages and disadvantages. One of the advantages of RIE is that it is capable of removing substantially all of the materials currently used in semiconductor processing, including silicon, silicon oxide, silicon nitride, aluminum, aluminum alloy, polysilicon, photoresist, antireflective coating, silicides and silicon oxynitride. The cleaning of these materials can involve the use of chemicals that must be reclaimed and/or disposed of according to government guidelines. Other disadvantages of using certain materials when is that when deposits to be removed are greater than a certain thickness, certain planarization processes like CMP are less effective. In the past the use of CMP has meant that certain materials were thought to less suitable because they could degrade during the CMP process. One of the disadvantages of CMP is that the not all surfaces are "rigid" enough to be polished. There are situations where it would be advantageous to use the CMP process if there were a material available which would both polish preferentially and be easily removed from the underlying layer.

As shown in FIG. 1, the conformal deposition of a layer, 5, of a material leaves portions of the material, 5, on regions of the surface other than the target region 5a. To remove the material from the untargeted regions and to planarize the last deposited surface, 5, the surface must be treated. A treatment usually includes CMP and/or RIE. RIE is usually used where the layer deposited is of sufficient thickness that the CMP process is less than optimally effective. However, if RIE is to be used, then the targeted areas, 5a, must be protected during the RIE process. Usually, the targeted areas are covered. When depositing a "covering" layer, 10, as shown in FIG. 2, it can be seen that covering layer, 10, is usually conformally deposited also. It can be imagined where the processing of each of the last two layers is complex it increases the complexities of the overall wafer processing. It would therefore be desirable to use a material for the covering layer, 10, that would not only "protect" the targeted areas, but also help minimize the overall processing complexity. Photoresist is a material that tends to need less complex processing, but historically it has not been used in CMP processing. Thus, there remains a need for a method for CMP processing utilizing photoresists.

SUMMARY OF THE INVENTION

It is therefore an object of the present to invention to provide a method for CMP processing photoresists.

It is a further object of the present invention to provide a method for removing material deposited in untargeted areas.

In accordance with the above listed and other objects, we provide a method for polishing an object having a layer of photoresist, the method, comprising:

a) applying a layer of slurry on an a layer of photoresist on an object having a first and a second side, the layer of photoresist on one of the first and second side, the object having a center axis perpendicular to the first and second side;

b) contacting the layer of slurry with a pad having a first and second side, the first side of the pad exerting a force on the slurry.

DETAILED EMBODIMENT

Figure 1:
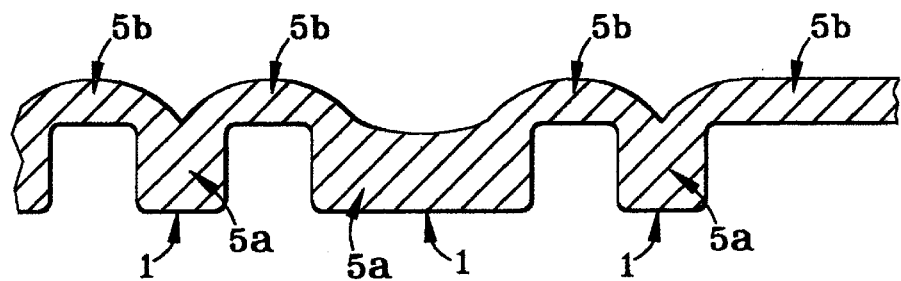
FIG. 1 is a cross sectional view showing the deposition step prior to the steps in the instant invention.

Photoresists have traditionally not been polished. Historically, photoresists have not been thought to have the physical integrity necessary to withstand the polishing. One of the reasons is that the pH of the slurries traditionally used during the CMP process tend to degrade photoresists, hardened or unhardened. The instant invention teaches a method of polishing photoresist such that photoresist can be considered a candidate for processing flows that require that a sacrificial layer be applied, as well as other applications.

It has been found that photoresist degradation can managed such that the amount of degradation does not affect the processing of the current level during semiconductor manufacturing. The "chemical" and "mechanical" portions of the CMP process should all maximized. Substantially all of the factors that affect CMP, including, but not limited to, slurry composition and pH, pad size and composition, and duration of polishing can be accounted for with the method of this invention.

Since photoresist degrades most rapidly in a basic environment it is advantageous to control the pH of the slurry used to CMP to minimize degradation. In the instant invention the pH of the CMP slurry should be at least about 2 and at most about 6. Preferably, the pH of the slurry would be at least about 4.1 and at most about 4.2. The slurry composition would contain an abrasive, an acid, and an additive in an aqueous solution. The abrasive could be silica, alumina, ceria, $TiO_2$, or a combination thereof. Preferably, the abrasive would be silica, alumina or a combination thereof. Most preferably, the abrasive would be silica. The additive in the instant invention would be a poly(acrylic) acid ( [—CH2CH (COOH)—]n) having a molecular weight of at least about 400 and at most about 400,000, and preferably a molecular weight of about 2000. The acid could be phosphoric, acetic, sulfuric, boric nitric or a combination thereof. Preferably, the acid would be phosphoric acid or nitric acid. Most preferably, the acid would be phosphoric acid. Finally, the temperature of the slurry should be between 50–120° F. More preferably, the temperature of the slurry would be between 100–120° F. Most preferably the temperature of the slurry would be 115±1° F.

An example of a slurry composition is given, for illustrative purposes only. Solution A contains about 100 ml of an acid, preferably (85%) phosphoric acid and about 900 ml of $H_2O$, preferably deionized $H_2O$. About 25 ml. of solution A is added to about 975 ml of a slurry, preferably a silica slurry having a pH of about 10.5, creating solution B. Next, 1 gram of the poly(acrylic acid), preferably a poly(acrylic acid) with a molecular weight of about 2,000 is mixed in $H_2O$, preferably deionized $H_2O$, such that the total volume of the poly(acrylic acid) solution is 1 liter. 1 gram/liter of the poly(acrylic acid) solution is added to solution B such that the total volume of solution B is 1 liter.

Another consideration that must be made when using a CMP process is the rate of removal of the target material versus the underlying material. In addition to selecting an appropriate slurry the "mechanical" portion of CMP must be controlled. The type and pad speed selected can be crucial. In the instant case, it would be advantageous to use polishing pads that would maximize the amount of material removed during the CMP process. Preferred pad types include IC1000®, SUBA IV®, PAN W®, POLITEX® or a combination thereof. Preferably, the pad type would IC1000® or SUBA IV®. IC1000®, SUBA IV® and POLITEX® are all trademarks of Rodel Inc. of Newark, Del. PAN W® is a trademark of Freudenberg Nonwovens of Lowell, Mass. The polishing itself would take place for a time period decided by the user for the particular thickness of photoresist to be removed. While polishing it can be beneficial that the following parameters be followed. It is preferable that the downforce, platen speed, carrier speed and the grit size and composition be controlled. For example, it is preferable if the downforce is at most about 6 psi. It is more preferable if the down force is at most about 2 psi. It is most preferable that the downforce is about 0.5 psi. It is preferable that the platen speed is between 10–100 rpm. It is more preferable if the platen speed is between 10–50 rpm. It is most preferable that the platen speed is about 23 rpm. It is preferable if the carrier speed is between 10–100 rpm. It is more preferable that the carrier speed is between 30–60 rpm. It is most preferable that the carrier speed be about 45 rpm. Finally, it is preferable that the grit be diamond grit. It is preferable that the size of the grit is 10–100 μm. It is more preferable that the grit be 50–100 μm. It is most preferable that the diamond grit be 70 μm.

Figure 2:
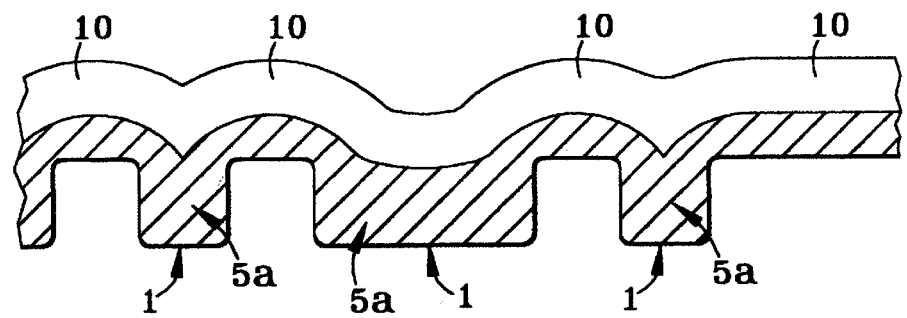
FIGS. 2–4 are cross sectional views showing an application for the method of the instant invention.
Figure 3:
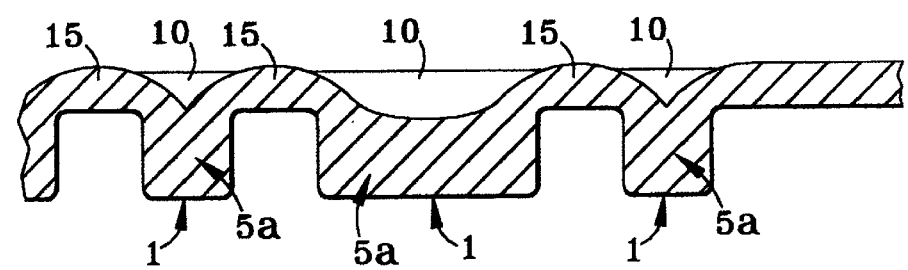
Figure 4:
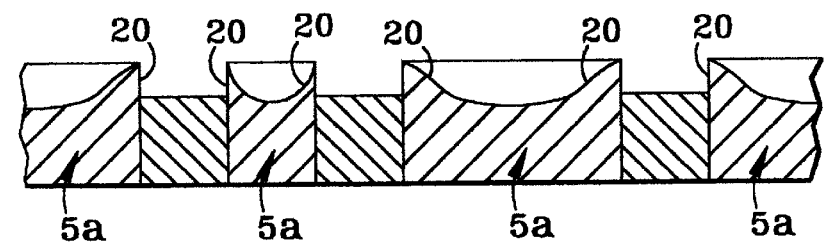

An example of an application of the method of the instant invention follows. Referring to FIGS. 1 and 2, layer 5 is an oxide layer and layer 10 is a layer of photoresist. Referring now to FIG. 3, the photoresist would be polished, using the slurry composition identified above and according the method outlined above, exposing the underlying oxide that was deposited on the untargeted areas, 15. The photoresist would then be removed as shown in FIG. 4, by any means known in the art, and a final step would be performed which would remove the "rabbit ears", 20, which remain. Preferably the rabbit ears, 20, would be undergo a CMP processing.

While the invention has been described in terms of specific embodiments, it is evident in view of the foregoing description that numerous alternative, modifications and variations will be apparent to those skilled in the art. Thus, the invention is intended to encompass all such alternatives, modifications and variations which fall within the scope and spirit of the invention and the appended claims.

What is claimed is:

1. A method for polishing an object having a layer of photoresist, the method comprising:
   a) applying a layer of slurry on an a layer of photoresist on an object having a first and a second side, the slurry comprising an abrasive, an acid and an additive, the abrasive selected from the group consisting of silica, alumina, ceria TiO2 and combinations thereof; the acid selected from the group consisting of phosphoric acid, acetic acid, sulfuric acid, boric acid, nitric acid and combinations thereof; and the additive selected from the group consisting of poly(acrylic) acids having a molecular weight of at least about 400 and at most about 400,000, the layer of photoresist on one of the first and second side, the object having a center axis perpendicular to the first and second side;
   b) contacting the layer of slurry with a pad having a first and second side, the first side of the pad exerting a force on the slurry.

2. The method according to claim 1 wherein the slurry comprise silica, 10% by volume phosphoric acid, poly (acrylic) acid having a molecular weight of about 2000, pH of about 4.1 and the pad is IC1000/Sorba IV.

3. The method according to claim 1 wherein the pad is selected from the group consisting of IC1000®, SUBA IV®, PAN W®, POLITEX® or a combination thereof.

4. The method according to claim 1 wherein the layer of photoresist was treated prior to the application of the slurry.

5. The method according to claim 4 wherein the treatment comprises UV hardening.

6. The method according to claim 1 wherein the force exerted by the pad is at least greater than 0 and at most 6 pounds per square inch (psi).

7. The method according to claim 6 wherein the force exerted by the pad is about 0.5 psi.

8. The method according to claim 1 wherein the pad rotates around the center axis, substantially parallel to the first surface.

9. The method according to claim 8 wherein the pad rotates at least about 10 and at most about 100 rpm.

10. The method according to claim 9 wherein the pad rotates at about 23 rpm.

11. The method according to claim 1 wherein the object rotates about the center axis.

12. The method according to claim 11 wherein the object comprises a wafer.

13. The method according to claim 12 wherein the object further comprises a carrier, the carrier in contact with the other of the first or second side not in contact with the slurry.

14. The method according to claim 13 wherein the carrier rotates at least about 10 rpm and at most about 100 rpm.

15. The method according to claim 14 wherein the carrier rotates about 45 rpm.

16. The method according to claim 1 wherein the abrasive is silica.

17. The method according to claim 1 wherein the slurry comprises 10% by volume phosphoric acid.

18. The method according to claim 16 wherein the slurry comprises 10% by volume phosphoric acid.

19. The method according to claim 1 wherein the poly (acrylic) acid has a molecular weight of about 2000.

20. The method according to claim 19 wherein the poly (acrylic) acid has a molecular weight of about 2000.

21. The method according to claim 1 wherein the pH of the slurry is at least about 4.1 and at most about 4.2.

22. The method according to claim 21 wherein the pH of the slurry is at least about 4.1and at most about 4.2.

* * * * *